United States Patent [19]

Wilson et al.

[11] Patent Number: 5,024,872
[45] Date of Patent: Jun. 18, 1991

[54] SHEETS OF STRETCHED AND POLARIZED POLYMER MATERIALS AND METHOD OF MANUFACTURER

[75] Inventors: David T. Wilson, Billerica; Roger H. Tancrell, Cambridge, both of Mass.

[73] Assignee: Raytheon Company, Lexington, Mass.

[21] Appl. No.: 86,176

[22] Filed: Aug. 13, 1987

Related U.S. Application Data

[63] Continuation of Ser. No. 834,290, Feb. 27, 1986, abandoned.

[51] Int. Cl.$^5$ .......................... B32B 7/02; B32B 27/00
[52] U.S. Cl. ..................................... 428/212; 428/421
[58] Field of Search ............... 428/421, 422, 212, 208; 367/169, 159, 151, 140, 163; 310/311; 178/63 R

[56] References Cited

U.S. PATENT DOCUMENTS

| | | | |
|---|---|---|---|
| 2,399,820 | 5/1946 | Morgan . | |
| 3,921,125 | 11/1975 | Miller et al. | 367/169 |
| 3,978,446 | 8/1976 | Miller . | |
| 4,011,540 | 3/1977 | Farr . | |
| 4,099,022 | 7/1978 | Fullerton et al. | 178/63 R |
| 4,183,010 | 1/1980 | Miller | 367/159 X |
| 4,197,920 | 4/1980 | Cluzel et al. | 367/151 X |
| 4,245,329 | 1/1981 | Dubois | 367/140 |
| 4,340,786 | 7/1982 | Tester | 428/208 |
| 4,433,400 | 2/1984 | DeReggi et al. | 367/163 X |
| 4,565,940 | 1/1956 | Hubbard, Jr. | 310/311 X |
| 4,626,730 | 12/1956 | Hubbard, Jr. | 310/317 X |

FOREIGN PATENT DOCUMENTS

| | | |
|---|---|---|
| 0013952 | 8/1980 | European Pat. Off. . |
| 796418 | 6/1958 | United Kingdom . |
| 807019 | 1/1959 | United Kingdom . |
| 847866 | 9/1960 | United Kingdom . |
| 872160 | 7/1961 | United Kingdom . |
| 1354865 | 5/1974 | United Kingdom . |
| 1358168 | 6/1974 | United Kingdom . |
| 2012519 | 7/1979 | United Kingdom . |
| 2042256 | 9/1980 | United Kingdom . |

OTHER PUBLICATIONS

M. Latour, "Importance of Injection Processes in the Formation of the Piezoelectric Effects of Polyvinylidene Fluoride" (Translation), J. Physique Filters 41:L-35-L-38 (1980).

Abstract, R 19, J2969/39-SU638-908, 12-1978 of USSR Pat. 0638908.

E. Eisenmenger et al., "Observation of Change Compensated Polarization Zones in Polyvinylidenefluoride" (PVDF) Films by Piezoelectric Acoustic Step-Wave Response, Solid State Communications, vol. 41, No. 12, pp. 917-920 (1982).

Fukador et al., "Piezoelectricity in Polarized Polyvinylidene Fluoride Films", Polymer Journal, vol. 2, No. 5, pp. 656-662 (1971).

(List continued on next page.)

Primary Examiner—Thomas J. Herbert
Attorney, Agent, or Firm—Denis G. Maloney; Richard M. Sharkansky

[57] ABSTRACT

A sheet of polymer material is secured between a pair of clamping members. The sheet is directed through a localized heated region to provide a localized heated portion of said sheet. A first one of said clamping members is pulled away from the second clamping members to stretch said sheet and create from the localized heated portion of said sheet a neck-down region. The neck-down region separates providing a pair of neck-down region portions and a reduced thickness portion or stretched portion of the sheet between said neck-down region portions. One of said neck-down regions propagates along unstretched portions of the sheet as the movable clamping member moves away from the fixed clamping member while the other neck-down region remains adjacent the fixed member. This propagating neck-down region portion of the sheet is kept within the localized heated region by moving the localized heated region at a rate related to the rate which unstretched material of the sheet is fed into the neck-down region portion. While the neck-down region portion is maintained within the localized heated region, an electric field is applied to the neck-down region portion to polarize the film.

13 Claims, 5 Drawing Sheets

OTHER PUBLICATIONS

Furykawa et al., "Piezoelectricity of Corona-Poled Polyvinylidene Fluoride", Kobunshi Ronbusher; vol. 36, No. 10, pp. 685–688, Oct. 1979.

Hayakawa et al., "Piezoelectricity and Related Properties of Polymer Films", Advances in Polymer Science, vol. 11, p. 43, Springer-Verlag Berlin (1973).

Miller, "High Pressure Transducer", Jan. 10, 1973, pp. 1–132, GTF Sylvania, NTIS 0307.

F. I. Mopsik et al., "Poling Behavior of Polyvinylidene Fluoride at Room Temperature", Appl. Phys. Lett. 44(1), Jan. 1984, pp. 65–67.

Dessler et al., "Piezoelectricity in $PYF_2$", J. Acoustic Soc. Amer., vol. 70, No. 6, Dec. 1981, pp. 1596–1608.

"Piezoelectricity of Corona-Poled Polyvinylidene Fluoride" (Kobunshi Ronbunshu), vol. 36, No. 10, pp. 685–688 (Oct. 1979), T. Furukawa, T. Goho, M. Date, T. Takamatsu and F. Fukada.

NON-VOIDED

VOIDED

MAGNIFICATION: 10,000X

SHEETS OF STRETCHED AND POLARIZED POLYMER MATERIALS AND METHOD OF MANUFACTURER

This application is a continuation of application Ser. No. 834,290 filed 2/27/86, now abandoned.

BACKGROUND OF THE INVENTION

This invention relates to the manufacture of piezoelectric material and, more particularly to the manufacture of piezoelectric material by molecularly polarizing a polymer material.

As is known in the art, certain polymer and copolymer materials may be provided with piezoelectric properties. For example, a sheet of a polymer material comprising polyvinyldene fluoride (PVDF) having long repeating chains of $CH_2$—$CF_2$ molecules may have these chains "orientated" to provide a net polarization. Such a sheet of orientated material disposed between a pair of electrodes, for example, may be used to either detect or produce mechanical energy. In one mode of operation, mechanical energy incident upon the combination of electrodes and sheet of material will mechanically deform the orientated crystalline structure of the sheet. This mechanical change results in a voltage potential being produced through the sheet of material and, hence, provides a potential difference between the pair of electrodes. In a second mode of operation, a voltage applied to the pair of electrodes induces a potential difference through the sheet of material causing the orientated structure of the material and hence the combination to mechanically deform in response to the voltage difference, thereby producing mechanical energy.

Several methods are known in the art for providing very thin films of molecularly polarized polymer materials such as PVDF material having suitable piezoelectric properties. One such method described in a paper entitled "Piezoelectricity Of Corona-Poled Poly (vinylidene fluoride)" by T. Furokawa et al, The Society of Polymer Science, Japan, Vol. 36, No. 10, pps. 685—688, Oct. 1979. In the described method, the ends of a sheet of PVDF material are secured between a pair of members of a stretching apparatus. Both of these members move away from each other to stretch the material. Prior to stretching the material, however, the apparatus is placed within an oven which is heated to a predetermined temperature until the material of the sheet softens. At this juncture, the material is stretched by moving both securing members away from each other. While the material is being stretched, corona discharge is provided above and below the film to create an electric field across the film to orientate the PVDF material. While this technique produces polarized material having piezoelectric properties, still there are several problems associated with this technique. The first problem is that by heating the entire film, it is difficult to keep the ends of the sheet locked in the members of the stretching apparatus. This is because the entire sheet softens including the ends of the sheet disposed within the members. These ends may have a tendency while the sheet is being stretched to slip out of the members thereby aborting the polarizing and stretching run. Since the temperature of the sheet cannot readily be changed and the force applied to the sheet also cannot be changed during the process, the stretch ratio of the sheet is thus generally limited to the so-called "natural draw ratio" of the plastic which here for PVDF is about 4:1. Higher stretch ratios should provide material having better piezoelectric properties. Furthermore, with this technique, it would be difficult to stretch and pole a relatively large sheet since the oven would have to be made correspondingly large. Since each sheet, however large, has to be loaded within the oven and the oven then brought up to operating temperature, this technique would also be difficult to adapt for a continuous stretching and poling operation. Therefore, this technique is not well suited for stretching and poling large quantities or continuous runs of PVDF material.

SUMMARY OF THE INVENTION

In accordance with the present invention, a method of providing a sheet comprising a molecularly polarized polymer material includes the step of: directing the unpolarized polymer sheet through a localized heated region while reducing the thickness of said sheet while the sheet is disposed within the localized heated region and applying an electric field to the region of the sheet where the thickness of the sheet is being reduced. With this arrangement, by providing a localized heated region and applying an electric field to polarize the sheet in said region, a molecularly polarized polymer sheet is provided having stable, long term piezoelectric properties. Furthermore, by providing a localized heated region, the problems generally associated with heating the entire surface of the sheet with the resulting softening of the plastic in the moving members of the stretching device is generally eliminated. Hence, this method provides a more reproducible and less expensive technique for stretching and polarizing polymer sheets to produce a molecularly polarized material by reducing the number of aborted production runs. Furthermore, by providing a localized heated region and polarizing the material in the reduced thickness region disposed in said localized heated region, the process of stretching and polarizing occurs simultaneously since the region in which the sheet is being stretched is also the region in which the sheet is being polarized. This provides material having improved piezoelectric and mechanical properties.

In accordance with a further aspect of the present invention, a sheet of polymer or copolymer material is disposed in tension between a pair of members. A localized heated region is provided and the tensioned sheet is disposed through said region to provide a localized heated portion of said sheet. A first one of said members is moved with respect to the second member to stretch said sheet and create a neck-down region from the localized heated portion of said sheet. The neck-down region separates providing a pair of neck-down region portions and a reduced thickness portion or stretched portion of the sheet between said neck-down region portions. One of said neck-down region portions propagates along unstretched portions of the sheet as the movable member moves away from the fixed member while the other neck-down region portion remains adjacent the fixed member. This propagating neck-down region portion of the sheet is kept within the localized heated region by moving the localized heated region at a rate related to the rate which unstretched material of the sheet is fed into the propagating neck-down region portion. While this neck-down region is maintained within the localized heated region, an electric field is applied to the propagating neck-down region portion of the film to polarize the film as it is being stretched. With this arrangement, by providing a localized heated region and keeping the propagating neck-down region portion of the sheet within the localized heated region, the problems generally associated with heating the entire sheet such as the softening of the plastic within the movable members of the stretching apparatus is generally eliminated. Further, by providing a localized heated region and keeping the propagating neck-down region portion of the sheet within the localized heated region while directing the propagating reduced thickness region through an electric field, the portion of the sheet which is being stretched and polarized is also being quenched. This quenching or cooling of the reduced thickness region after the voltage and heat have been applied to the reduced thickness region is believed to enhance and stabilize the piezoelectric properties of the polarized polymer material.

In accordance with a still further aspect of the present invention, a method of providing a molecularly polarized polymer material comprises the steps of: providing said polymer material having been extruded along a first direction and stretching said material along a direction orthogonal to said extruded direction while directing said material through an electric field region. Preferably, said material is also directed through a localized heated region to thereby provide a polymer material having improved piezoelectric properties.

In accordance with a still further aspect of the present invention, a sheet of a molecularly polarized polymer or copolymer material has a layered cross-sectional structure. A pair of outer layer surfaces of said sheet of polymer material are comprised of the polymer material having a first modulus of elasticity, a first density, a first hydrostatic charge sensitivity and a first relative permittivity. The center or inner layer disposed between the pair of outer layers of the sheet comprises the polymer or copolymer material having a density lower than the density of the aforementioned outer layers, a hydrostatic charge sensitivity higher than the hydrostatic charge sensitivity of the aforementioned outer layers, a modulus of elasticity lower than the modulus of elasticity of the pair of outer layers and a relative permittivity lower than the relative permittivity of the outer layers. With this arrangement, a self-stiffened sheet of a PVDF material is provided since the outer layers of the PVDF material have a higher modulus of elasticity than the central layer of the PVDF material. The self-stiffened sheet of PVDF material is believed to provide an increase in the hydrostatic charge sensitivity of the sheet. The hydrostatic charge sensitivity $d_h$ is generally defined as: $d_h = d_{31} + d_{32} + d_{33}$, where the tensor quantities $d_{ij}$ are defined in terms of charge per unit force with i representative of the direction at which the charge is collected and j is representative of the direction in which hydrostatic pressure is applied with respect to the stretch direction. Generally, $d_{33}$ is the hydrostatic charge sensitivity tensor quantity which contributes to the hydrostatic charge sensitivity $d_h$. The tensors $d_{31}$ and $d_{32}$ having an opposite sign reduce $d_h$. Accordingly, it is desirable to reduce the tensors $d_{31}$ and $d_{32}$. It has been observed that the placement of stiffening layers over a sheet of stretched and polarized PVDF material tends to decrease the quantity $d_{31}$ and, accordingly, increases $d_h$. Therefore, by providing a self-stiffened layer, it is believed that $d_{31}$ is decreased thereby increasing the hydrostatic charge density $d_h$.

In accordance with a still further aspect of the present invention, the layered structure provides a sheet having lower composite relative permittivity. In many hydrophone applications, lower relative permittivity is desirable because a higher voltage potential difference will be provided for constant charge output from the sheet. Further, the outer layers of the PVDF material have a substantially uniform surface morphology and are substantially free of voids thereby providing surfaces which are suitable for bonding and lamination of electrodes with low contact resistance.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENT

Figure 1:
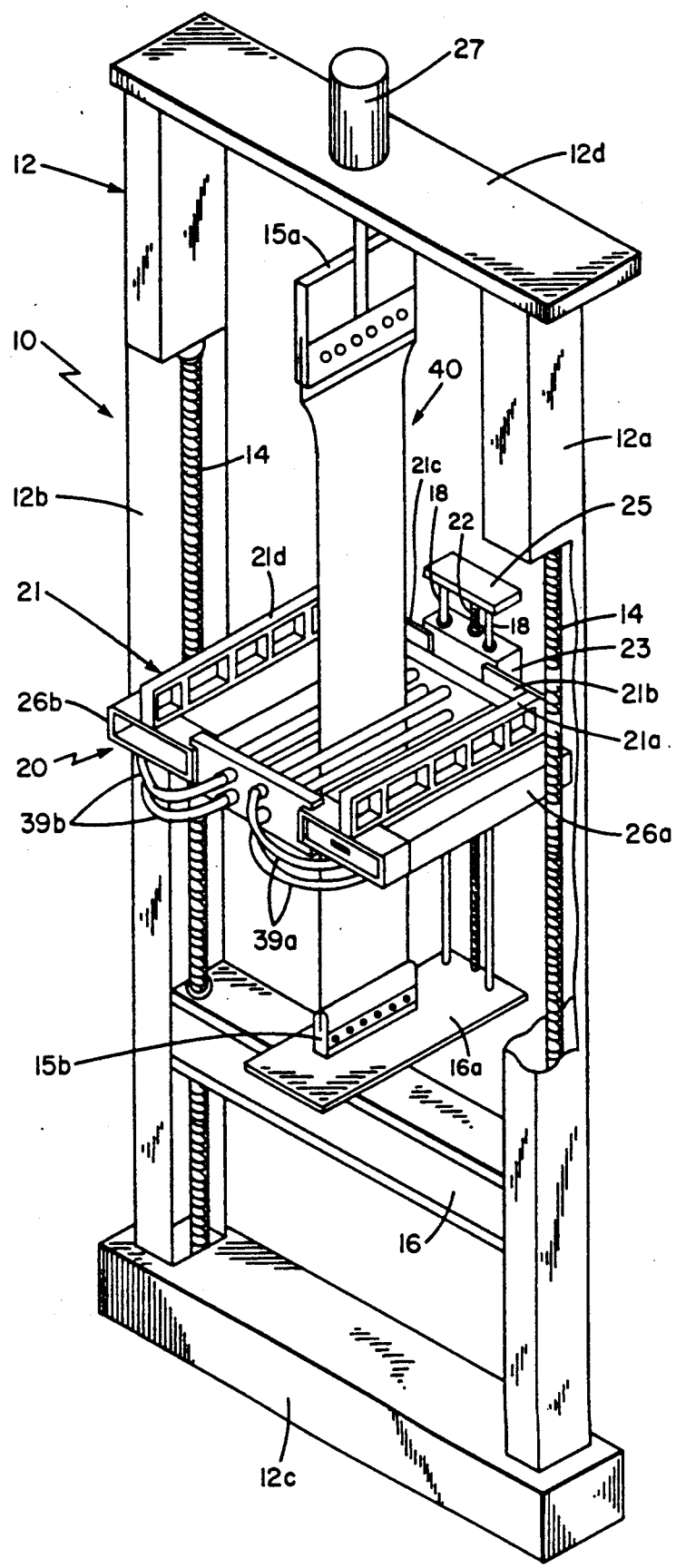
FIG. 1 is a diagrammatical isometric view of an apparatus used to stretch and polarize polymer material in accordance with the present invention.
Figure 2:
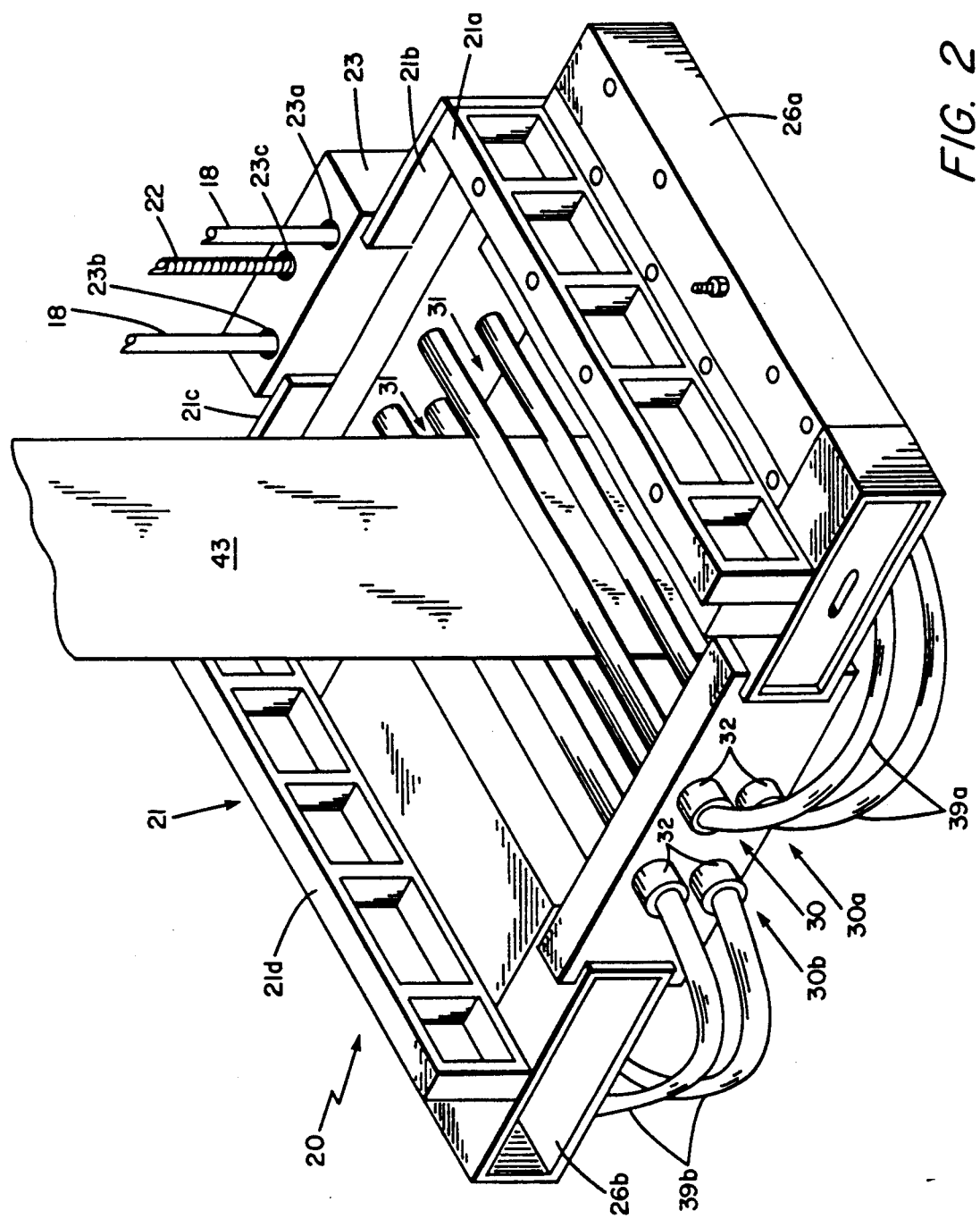
FIG. 2 is an enlarged isometric view of a portion of FIG. 1.
Figure 3:
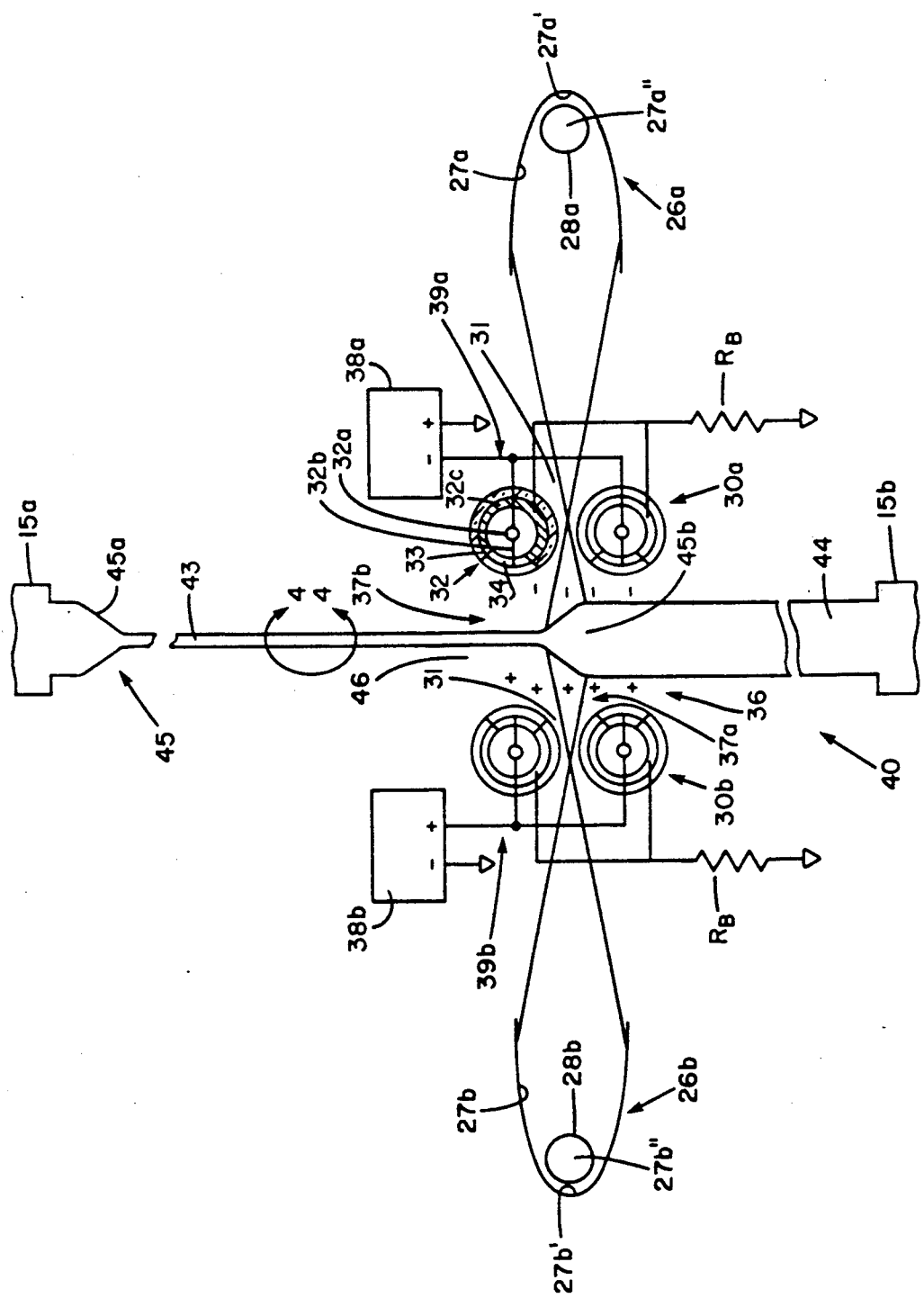
FIG. 3 is a diagrammatical view of a sheet being taken along lines 3—3 stretched in accordance with the invention of FIG. 2.

Referring now to FIGS. 1-3, an apparatus 10 for simultaneously stretching and polarizing a localized region (45b, FIG. 3) of a sheet 40 comprising a molecularly polarizable polymer or copolymer material is described. Sheet 40 is here a polymer material such as polyvinylidene fluoride (PVDF). Alternatively, a copolymer of polyvinylidene fluoride and a second polymer such as trifluoroethylene, tetrafluoroethylene and methylmethacrylate may be used. The apparatus 10 is shown to include a housing 12, having sidewall portions 12a, 12b, base portion 12c supporting sidewall portions 12a, 12b, and an overhead portion 12d supported by and attached to sidewall portions 12a, 12b. Housing 12 further includes threaded shaft members 14 disposed in sidewall portions 12a, 12b of housing 12, and means for rotating (not shown) said threaded shaft member 14 disposed in a base portion 12c of housing 12. A suitable means (not shown) such as a motor driven gear assembly is used to rotate both members 14. Threaded shaft members 14 are threadably engaged with a movable cross member 16. The rotating means rotate threaded shaft members 14 to move movable cross member 16 in an upward/downward direction. Housing 12 further includes a fixed locking jaw 15a which is attached to a load cell 27 disposed on the overhead portion 12d. Attached to movable cross member 16 is a second locking jaw member 15b. Locking jaw members 15a and 15b are provided to hold, particularly to hold in tension, sheet 40 of the polarizable material to be stretched and polarized. The cell 27 is connected to fixed member 15a and is used to sense the force applied thereto. Load cell 27 provides a signal which is related to the force applied to the sheet 40 when said sheet 40 is held in tension.

The apparatus 10 particularly in FIGS. 2 and 3 is shown to further include a polarizing and heating assembly 20. Polarizing and heating assembly 20 includes a frame 21 comprising members 21a-21d. Frame members 21b and 21c are connected together by a block 23 which has a pair of apertures 23a, 23b through which are disposed unthreaded shaft guides 18, and a threaded aperture 23c which is engaged with a third threaded shaft member 22. Threaded shaft member 22 is used to move the block 23 and hence zing and heating assembly 20 in an upward/downward direction with respect to movable cross member 16. Threaded shaft member 22, similarly, is attached to a rotating means, here a motor driven gear assembly (not shown), which rotates the threaded shaft member 22. Shaft guides 18 and threaded shaft 23 are attached between an extension member 16a disposed on cross member 16 and a plate 25 disposed over block 23.

Poling and heating assembly 20 further includes a pair of infrared directional lamp assemblies 26a, 26b which are secured
to frame 21 and, more particularly, to frame members 21a and 21d, respectively, as shown. Directional infrared lamps 26a, 26b each include a respective, here semi-elliptically shaped cylindrical surface 27a, 27b (FIG. 3), respectively, and an infrared lamp 28a, 28b (FIG. 3), respectively, disposed adjacent apex portions 27a', 27b' at foci 27a'', 27b'' of the semi-elliptical reflective surface 27a, 27b, respectively. The polarizing and heating assembly 20 further includes a corona discharge bar subassembly 30 comprised of here four corona discharge bars 32. The corona discharge bar subassembly 30 is connected to the frame 21 between the infrared directional lamps 26a, 26b, as shown. Here the infrared directional lamps 26a, 26b are arranged to direct the infrared energy therefrom between regions 31 provided between the respective pairs 30a, 30b of corona discharge bars 32, as shown. Thus, the infrared directional lamps provided are chosen to have a suitable focal length to direct infrared energy through the narrow regions 31. By directing the IR radiation through the regions 31 between the corona bar pairs 30a, 30b, a localized heated region 37a is provided which is free from shadows resulting from interference by the corona bars 30. Thus, the lamp assembly 30 provides uniform and optimum heating of the sheet as it passes through the polarizing and heating assembly 20. Further, the region 37a which is heated is relatively narrow, being confined generally to the vicinity of the sheet where a neck-down region portion of the sheet is provided as will be described. Thus, as the sheet passes out of said region 37a, it is quenched by leaving the heated region 37a and entering a cooler, ambient region 37b.

Each corona discharge bar 32 includes a center conductor 32a, needle electrodes 32b supported by said center conductor 32a, and outer conductors 32c dielectrically isolated from the center conductor 32a and needle electrode 32b as shown in FIG. 3. Corona discharge bars further have spaced along regular intervals of the outer conductor 32c apertures 34. Each aperture 34 exposes a corresponding one of said needle electrodes 32b. A potential applied between the inner and outer electrodes 32a, 32c, via supplies 38a, 38b as shown, provides a corona discharge along the corona bar 32. More particularly, as shown in FIG. 3, the center conductor 32a of each one of the first pair 30a of corona bars 32 is connected, via cables 39a, to a first common potential provided by the power supply source 38a, as shown in FIG. 3. The center conductor 32b of each one of the second pair 30b of corona bars 32 is connected, via cables 39b, to a second, preferably equal but opposite polarity potential provided by the second power supply 38b, as shown. The outer conductor 32c of each corona bar 32 is connected to a common reference potential through a corresponding one of a pair of ballast resistors $R_B$, here each of said ballast resistors $R_B$ being of approximately 300 Meg ohms, capable of dissipating 30 watts and here dissipating about 2.5 watts. In order to avoid shorting resulting from fringe discharge around edges of the sheets of PVDF material, the corona discharge bars are arranged to produce a corona discharge only in central portions of the sheet. Thus, here a dielectric sleeve 33 (FIG. 3) is provided over each outer conductor 32c of each corona discharge bar 32 and an aperture (not numbered) in said sleeve exposes only selected central ones of said needle electrodes to confine corona discharge only to central portions of the sheet.

In operation, a sheet 40 here of a molecularly polarizable polymer material such as polyvinyldene fluoride (PVDF) is positioned through a region 46 spacing the pairs 30a, 30b of corona discharge bar 32, and is held in tension between the fixed and movable jaw members 15a, 15b. The corona discharge subassembly 20 is provided in its initial position (not shown), here at the upper portion of the sheet 40 of polarizable material, adjacent the fixed jaw member 15a. The movable cross member 16 is also disposed in its initial position (not shown) at the upper portion of threaded shaft member 14.

During initial start-up the following procedure may be used. The sheet of PVDF material is placed in tension at a predetermined force per unit thickness which is typically 80% of the force used during stretching. As an example, for a 2mm thick, 10 inch wide sheet of PVDF, a stretching tension in the range of 2300 to 2700 lbs. is generally used and a pre-stretch tension of about 1,840 to about 2,100 lbs. is generally used, with the signal produced from the load cell 27 being monitored to determine the tension applied to the sheet. After the unstretched sheet has been placed in initial tension, the infrared lamps 26a, 26b *are activated to about* 80% of their steady state voltage to provide a localized heated region of the PVDF sheet 40. In response, the PVDF sheet 40 softens in this localized heated region and the tension drops to about 60% of stretch tension. The cross member 16 is then engaged by rotating shaft members 14 to restore the tension in sheet 40 to about 80% of stretch tension. After a period of time, the tension again drops to about 60% of stretch tension and at this juncture the cross member is engaged to stretch at 100% of stretch tension and the lamps 26a, 26b are activated to run at 100% of steady state voltage.

The threaded shaft member 14 thus is engaged to move the movable cross member 16 in a downward direction. In response to this initial movement of cross member 16, a neck-down region 45 is created in the sheet 40. A first neck-down region portion 45a remains adjacent to the fixed jaw member 15a, and a second neck-down region portion 45b remains disposed within a region of the polarizing and heating assembly 20 which is also engaged to move downward in accordance with the speed of member 16. Generally, since the stretch ratio is greater than one, the poling and heating assembly 20 must move at a rate equal to the stretch ratio to maintain the neck-down region portion 45b within the polarizing and heating assembly 20. After a predetermined amount of the sheet has been stretched during this initial start-up phase, the corona discharge bars 32 are activated providing a corona discharge over each surface of the sheet of PVDF material 40. The threaded shaft member 24 then continues to move poling and heating assembly 20 in a downward direction with respect to moving jaw member 15b. Heat is applied via lamps 26 and the threaded shaft member 24 moves at a rate given by $R_{24} = R_{16}/(SR-1)$ where SR is the stretch ratio and $R_{16}$ is the rate of member 16. Propagating neck-down region portion 45b is maintained disposed between the corona discharge bars 30 and in the localized heated region 37a during poling and stretching. Accordingly, the second neckdown region portion 45b and the poling and heating assembly 20 are fixed in position with respect to each other. Raw material 44 of sheet 40 is continually fed into the neck-down region portion 45b and is thus stretched, polarized and quenched. These process steps occur in a relatively narrow, confined region dynamically and simultaneously, without any objects such as extruders, electrodes or heated platens being placed in contact with the stretched material 43 or the neck-down portion 45b. The load cell 27 is used to sense the force being applied to the sheet 40 by producing an electrical signal related to the applied force. In preferred modes, this signal may be fed to either a motor control assembly or a lamp control assembly to vary either the speed at which the material is stretched or the temperature to which the IR lamps heat the sheet 40 to thereby control the force at which the PVDF sheet 40 is stretched. Here this sensed voltage is used to control the heat of the lamp assembly. Further, since the heat lamps store heat and have a relatively long thermal time constant, the rate of change in force is also sensed to anticipate changes in the heat generated by the lamp assembly 30.

By providing a localized heated region 37a and a localized corona discharge region which tracks or travels in accordance with the propagating neck-down region 45b of the PVDF sheet, localized, yet continuous and simultaneous polarizing and heating of the PVDF sheet is provided. By only locally heating the PVDF sheet, the sheet is made to travel from a relatively cool zone 37a into the heated zone 46 and emerge again into a cool zone 37b. This arrangement of consecutive cool, heated, and cool zones, as well as, a convection flow of air provided by the corona discharge more commonly referred to as "corona wind" over each of the major surfaces of the PVDF stretched sheet is believed to locally quench the stretched material 43 as it leaves the heated zone. It is believed that this "quenching" is partially responsible for the particular piezoelectric properties of the stretched material fabricated in accordance with this technique.

It is to be noted that during operation, there is no physical contact made with the sheet of PVDF material in the region where the sheet is poled and stretched. It is further to be noted that in addition to quenching the sheet of PVDF material as it emerges from the localized heated region, the localized heated region permits the plastic sheet to be maintained locked within the fixed and movable jaw easier than prior art techniques since the plastic will not tend to soften at the portions thereof locked in the jaws, but will only soften in the region where the localized radiant heat is applied. Therefore, there are less aborted stretching and poling runs using this technique since the tendency for the plastic to pull from the member during stretching as often occurs with prior techniques is reduced.

Figure 4:
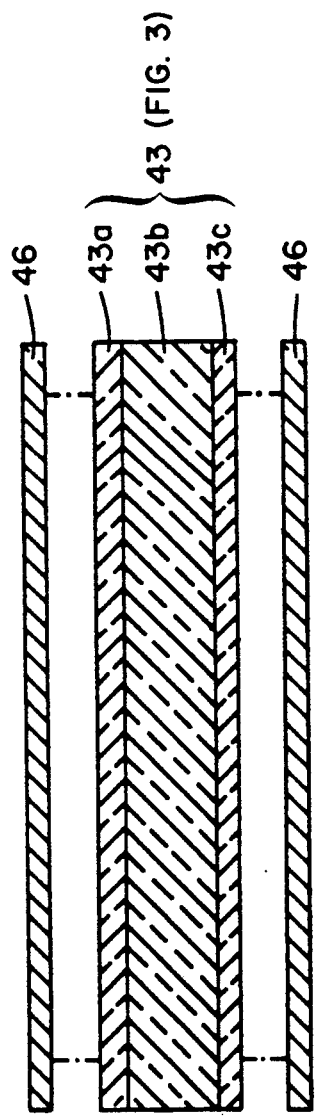
FIG. 4 is a cross-sectional view of a piezoelectric film having a pair of electrodes provided over opposing surface portions.
Figure 5A:
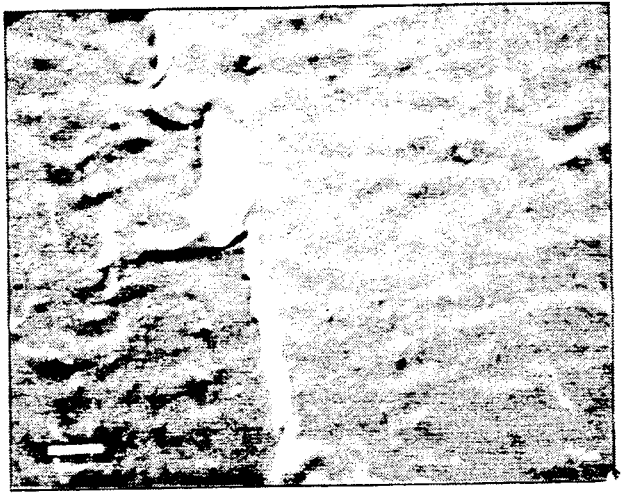
FIGS. 5A–5B are a series of photomicrographs showing the layered structure of PVDF material in accordance with an aspect of the present invention.
Figure 5B:
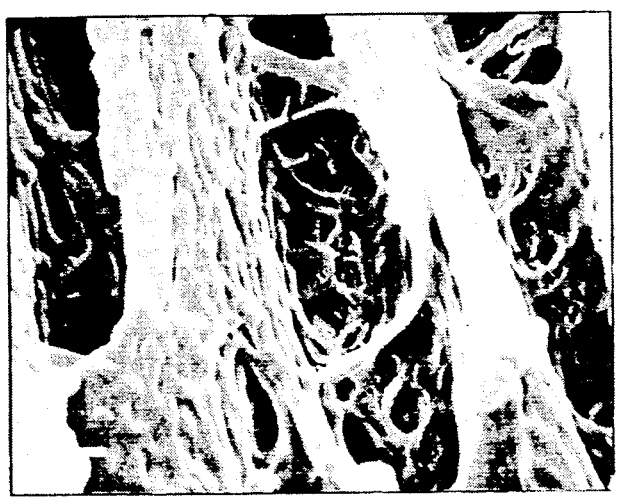
Figure 6A:
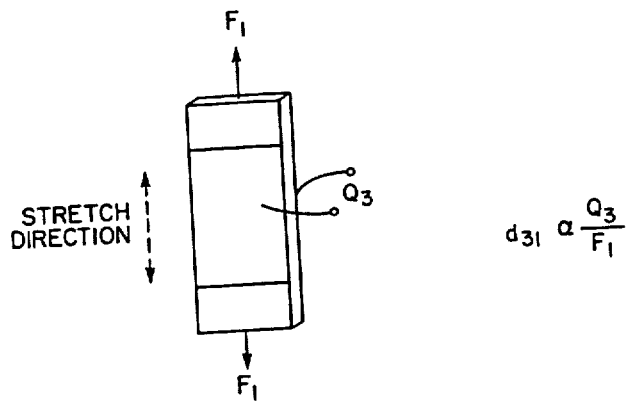
FIGS. 6A–6D are a series of diagrammatical views which show the relationship between stretch direction and hydrostatic piezoelectric tensors.
Figure 6B:
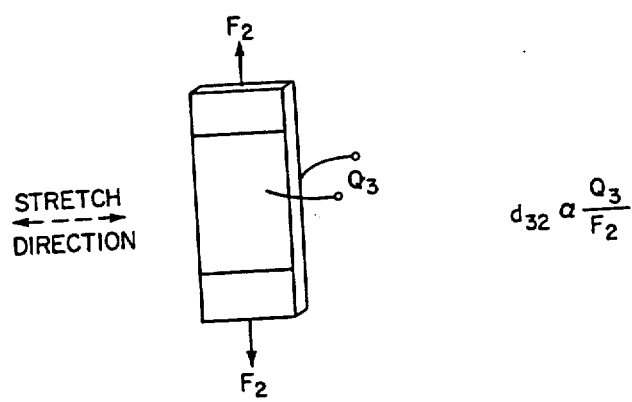
Figure 6C:
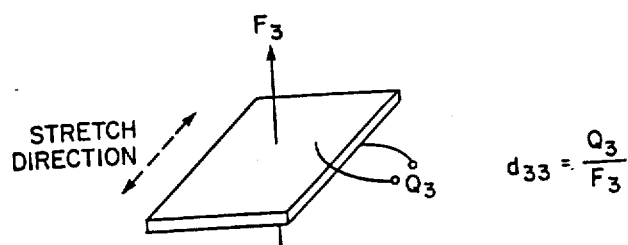
Figure 6D:
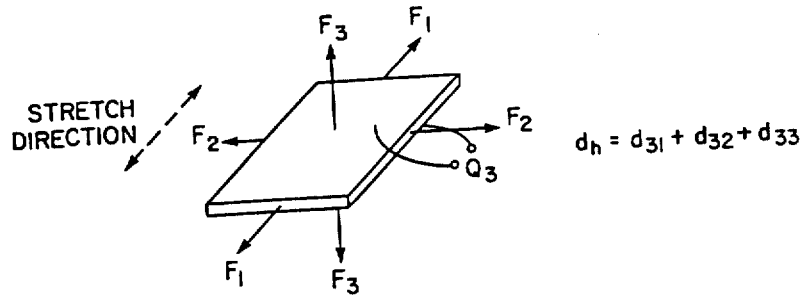

Referring now to FIG. 4, a cross-sectional view of a sheet 43 of stretched and polarized PVDF material having electrodes 46 disposed over major surfaces (not numbered) is shown. Here the sheet 43 of stretched and polarized PVDF material is shown to have three distinctive regions, a first center region 43b and a pair of outer regions 43a and 43c. Outer regions 43a, 43c have physical and electrical properties which are distinct from center region 43b. Outer regions 43a, 43c generally comprise about 18 to 22% each of the total thickness of the stretched/polarized sheet 43 whereas the center region comprises the remainder of the thickness or about 56% to 64% of the thickness of sheet 40. It is believed that PVDF material which has been stretched and poled in accordance with the above-described techniques will have this layered structure. It is further believed that the degree of voiding and extent of the layered structure is generally related also to the speed at which stretching occurs. Higher stretch speeds are believed to produce more voiding and better defined layered structures as shown in the photomicrographs of FIGS. 5A, 5B.

Electrical properties which are generally used to characterize the PVDF materials include 'the real part of the dielectric permittivity $\epsilon$ given by $=\epsilon'+j\epsilon''$; Mo the voltage sensitivity of the material under hydrostatic pressure expressed in db relative to $1V/\mu$ Pa where Pa is a pascal given as (force/unit area) and $d_h$ is the hydrostatic charge sensitivity. The quantity $d_h$ is generally given by the equation:

$$d_h = d_{31} + d_{32} + d_{33} \qquad (3)$$

where the quantities $d_{31}$, $d_{32}$ and $d_{33}$ are defined in FIGS. 6A- 6D as the charge in the 3 direction divided by the force in the i direction where i is equal to 1, 2 or 3 and where the force in the i direction is defined as the direction of the force applied to the material with respect to the stretch direction of the PVDF material. Typical values of each of these tensors for sheets polarized in accordance with the above techniques are $d_{31} 1+14 \ pC/N$; $d_{32} \approx +2 \ \approx C/N$; and $d_{33} \approx -34 \ \approx C/N$. Accordingly, it is generally desirable to make $d_{33}$ as negative as possible and reduce $d_{31}$ and $d_{32}$. It is believed that the layer structure for sheet 43 provides the unexpected result of providing a self-stiffened sheet which is believed to reduce $d_{31}$ and hence increase $d_h$.

As now understood, outer layers 43a, 43c are further characterized as having relatively high relative permittivities $\epsilon'$ and lower hydrostatic charge sensitivity $d_h$ in comparison to that of the central portion 43b. Typically, said relative permittivity is believed to be about in the range of 9.5 to 12. The outer layers 43a, 43c further have a higher density than the density of the inner layer. The outer layers 43a, 43c as shown in FIG. 5A have an appearance of being substantially uniform in morphology and substantially free of voids.

Inner layer 43b generally is believed to have a lower relative permittivity $\epsilon'$ than the outer layer typically about 5 to 8. The inner layer 43b has a voided appearance and as can be seen in FIG. 5B the inner layer has a substantial amount of voids. Furthermore, due to the relative differences in voiding between the outer layers 43a, 43c and the inner layer 43b, the Young's modulus ($Y_{11}$) (modulus of elasticity) or the measure of the stiffness of each layer is believed to be higher for the outer layers 43a, 43c than for the inner layer 43b. In general, materials fabricated in accordance with the present invention have a composite Young's modulus of about 2.5 ×10⁹ pascals.

It has been found advantageous to stretch the film in a direction which is orthogonal rather than parallel to the direction in which the film had been extruded. As is known in the art, sheets of PVDF material are generally fabricated by extruding raw molten PVDF material from an extrusion apparatus. It has been found that by stretching such a sheet of material or a portion of such a sheet of material in a direction perpendicular to the direction in which the sheet had been extruded enhanced piezoelectric properties are provided.

Examples of PVDF sheets that were stretched and polarized in accordance with the above-described technique are shown in the Table. Note all examples except #6 had sheet width of 10", number 6 had a sheet width of 6". The sheet thickness ($t_o$) is the thickness prior to stretching and the sheet thickness ($t_s$) is the thickness after stretching. The stretch ratio was determined by dividing the final length of the stretched portion of the sheet by the initial length of the portion of the sheet which was stretched.

cation of hydrophones using the PVDF material or during storage of hydrophones having PVDF material where such storage results in exposure to direct sunlight.

Further, when sheets of this PVDF material are used in hydrophone applications, the thickness of the sheet is relatively thin in comparison to an acoustic wavelength and these devices operate in a nonresonance mode. Accordingly, a low frequency figure of merit may be defined as:

$$\text{FOM} = M_O^2 \cdot C \qquad (1)$$

where $M_O$ is the voltage sensitivity (volts/pascal) and C is the electrical capacitance (farads/unit area). In terms of the intrinsic properties of the PVDF material, this figure of merit can be expressed as:

$$\text{FOM} = d_h^2 \cdot t/\epsilon' \qquad (2)$$

Therefore, according to Equation 2, this figure of merit (FOM) may be optimized by increasing the piezoelectric activity $d_h$, by making the material as thick as possible, and also by making the dielectric constant as small as possible. However, as is generally appreciated, the material should have a sufficient dielectric constant to provide the device with sufficient capacitance to drive commercial FET amplifiers, for example. Sheet 43 hav-

TABLE

| | | Conditions | | | | | | Characteristics | | |
|---|---|---|---|---|---|---|---|---|---|---|
| | | Supply | Stretch Tension | Approx. Surface | Stretch | Stretch Rate | Anneal for | | | |
| No. | $t_o$ (mm) | Voltage (KV) | Force (lbs.) | Temp. (°F.) | Ratio (mm/mm) | inches/ min. | 6 hrs. @ 90° C. | $t_s$ (μm) | ($d_h$) (pC/N) | $\epsilon'$ | Mo (db) |
| 1 | 2 | ±30 | 2600 | 230 | 5.5:1 | 10 | No | 580 | 22 | 6.8 | — |
| 2 | 2 | ±30 | 2600 | 230 | 5.5:1 | 10 | Yes | 580 | 19 | 6.8 | 194.8 |
| 3 | 2 | ±30 | 2400 | 240 | 5.5:1 | 10 | No | 538 | 18.1 | 8.15 | −197.4 |
| 4 | 3 | ±20 | — | — | 4.5:1 | 0.5 | No | 800 | 12.5 | 10.0 | −198.8 |
| 5 | 3 | ±23 | 5100 | — | 4.5:1 | 1 | No | 880 | 13.7 | 9.7 | −197.0 |
| 6 | 3 | ±35 | 3300 | 250 | 4.5:1 | 2 | No | 1050 | 16.5 | 8.6 | −192.9 |
| 7 | 1.5 | ±25 | 2500 | — | 6.0:1 | 10 | No | 375 | 22 | 7.35 | −197.9 |
| 8 | 1.5 | ±25 | 1675 | 225 | 5.5:1 | 12 | Yes | 360 | 18.3 | 8.1 | −200.8 |
| 9 | 1.5 | ±25 | 2000 | 215 | 6.0:1 | 10 | No | 403 | 19.3 | 7.53 | −198.631 |

Figure 7:
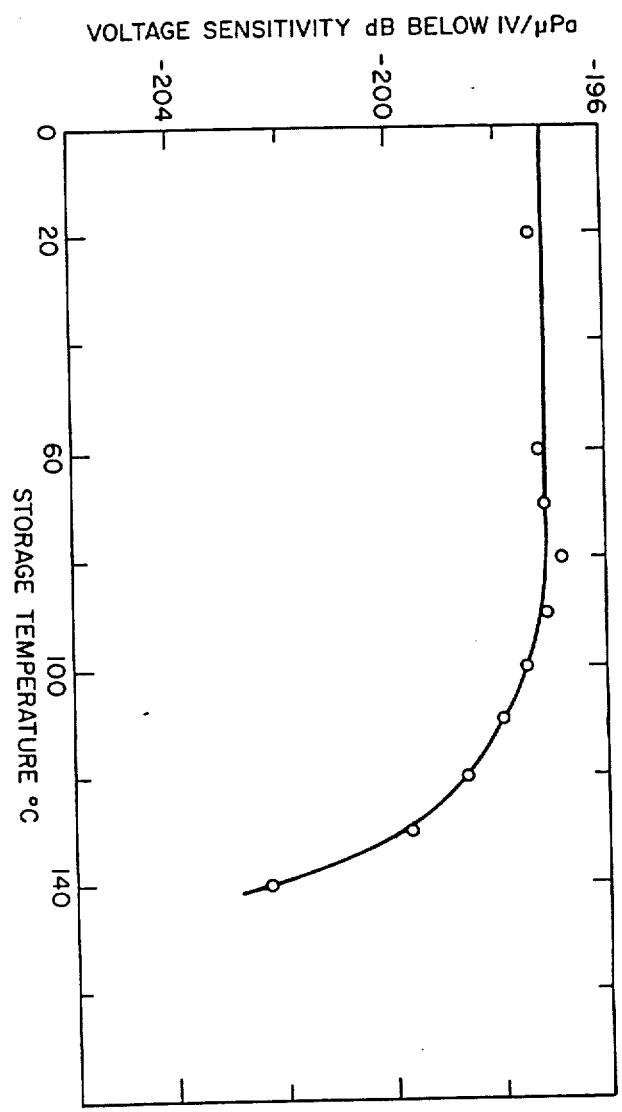
FIG. 7 is a plot of voltage sensitivity vs. storage temperature for PVDF material in accordance with an aspect of the present invention.

As shown in the Table, examples 2 and 8 were annealed after stretching and polarization of the PVDF material. Generally, stretched and polarized PVDF material is annealed by placing said material between a pair of flat plates to prevent curling of the sheet (not shown) and subjecting said material to a high temperature of here 90° C. for a period of at least 6 hours. Examples 1 and 2 were fabricated from the same sheet under the same fabrication conditions. A comparison of the hydrostatic charge sensitivity $d_h$ characteristic for both examples 1 and 2 show a decline in the hydrostatic charge sensitivity of 3 pC/N after annealing. However, as shown in FIG. 7, a typical graph of such material after annealing as a function of storage temperature for a period of one hour, shows that the hydrostatic charge sensitivity measured at the end of one hour is substantially constant up to about 90° C. Accordingly, in accordance with a further aspect of the invention, the post annealing after stretching and polarization is shown to stabilize the piezoelectric properties of the material with respect to subsequent temperature exposures.

This stability characteristic with respect to temperature is extremely important. Although in typical applications for these materials such as sonar applications the PVDF material is never exposed to such high temperatures during operation, the PVDF material nevertheless may be exposed to such high temperatures during fabriing the layered structure which provides a lower composite permittivity $\epsilon'$ and higher hydrostatic charge sensitivity $d_h$ therefore provides material having an optimum FOM.

Having described preferred embodiments of this invention, it will now be apparent to one of skill in the art that other embodiments incorporating its concept may be used. It is felt, therefore, that this invention should not be limited to the disclosed embodiments, but rather should be limited only by the spirit and scope of the appended claims.

What is claimed is:

1. A sheet comprising:
  a molecularly polarized polymer material having a multilayered structure comprising:
  a pair of outer surface layers of said sheet each surface layer having a first modulus of elasticity, a first density, a first hydrostatic charge sensitivity and a first relative permittivity; and
  an inner region of said sheet disposed between said pair of outer surface layers of the sheet having a second modulus of elasticity which is lower than the modulus of elasticity of each of said pair of outer surface layers, a second density which is lower than the density of said pair of outer surface layers, a second hydrostatic charge sensitivity which is higher than the hydrostatic charge sensitivity of said pair of outer surface layers, and a relative permittivity which is lower than the relative permittivity of said pair of outer surface layers.

2. The sheet as recited in claim 1 wherein the first relative permittivity is in the range of 9.5 to 12 and the second relative permittivity is the range of 5 to 8.

3. The sheet as recited in claim 1 wherein said polymer material comprises polyvinyldene fluoride.

4. A sheet comprising:
a molecularly polarized polymer material with said sheet having a multilayered cross section comprising:
a first outer surface layer having a first modulus of elasticity and a first density;
a second outer surface layer having a second modulus of elasticity and a second density; and
an inner region layer disposed between said first and second outer surface layers having a third modulus of elasticity and a third density;
wherein said first and second moduli are each higher than the third modulus, and the first and second density are each higher than the third density.

5. The sheet of claim 4 wherein the polymer comprises polyvinyldene fluoride.

6. The sheet of claim 4 wherein the first and second moduli are substantially equal and the first and second densities are substantially equal.

7. The sheet of claim 6 wherein the polymer comprises polyvinyldene fluoride.

8. A sheet comprising:
a molecularly polarized polymer material having a multilayered cross-section with first and second outer surface regions, each having a first density and first hydrostatic charge sensitivity and an inner region disposed between said first and second outer surface regions having a second lower, density than said first density and second hydrostatic charge sensitivity; and
said sheet having a substantially constant hydrostatic charge sensitivity as a function of operating temperature over the temperature range of 25° C. to 90° C.

9. The sheet of claim 8 wherein the polymer is polyvinylidene fluoride.

10. The sheet of claim 9 comprising:
a pair of conductive electrodes disposed on first and second opposing surfaces of said sheet.

11. The sheet of claim 10 wherein said first and second outer surface regions each are about 18-22% of the total thickness through the cross section of the sheet and the central region is about the remainder of the thickness of the sheet.

12. The sheet of claim 11 wherein said sheet has a thickness in the range of about 360 $\mu$m to 580 $\mu$m and a hydrostatic charge senstivity of at least 18.1 $pC/N$.

13. The sheet of claim 12 wherein said sheet further has voltage sensitivity of at least about −197db re (1V/$\mu$Pa) over the temperature range of about +25° C. to +90° C.

* * * * *

UNITED STATES PATENT AND TRADEMARK OFFICE
CERTIFICATE OF CORRECTION

PATENT NO. : 5,024,872

DATED : June 18, 1991

INVENTOR(S) : David T. Wilson

It is certified that error appears in the above-identified patent and that said Letters Patent is hereby corrected as shown below:

The sheets of drawings consisting of Figs. 6A-6D and Fig. 7, should be added as shown on the attached pages.

Signed and Sealed this

Eighth Day of December, 1992

Attest:

DOUGLAS B. COMER

*Attesting Officer*     Acting Commissioner of Patents and Trademarks